(12) United States Patent
Kariya

(10) Patent No.: US 6,573,185 B2
(45) Date of Patent: Jun. 3, 2003

(54) MANUFACTURE OF A SEMICONDUCTOR DEVICE

(75) Inventor: Atsushi Kariya, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 09/804,788

(22) Filed: Mar. 13, 2001

(65) Prior Publication Data
US 2001/0024874 A1 Sep. 27, 2001

(30) Foreign Application Priority Data
Mar. 23, 2000 (JP) ........................................ 2000-082429

(51) Int. Cl.$^7$ ............................................... H01L 21/44
(52) U.S. Cl. ........................ 438/685; 438/648; 438/656; 438/679; 438/680
(58) Field of Search ................................. 438/660, 680, 438/681, 679, 685, 761, 622, 625, 627, 628, 642–644, 648, 656; 427/69, 96, 99, 250, 252–253, 374.1, 398.1; 118/666, 697, 698

(56) References Cited

U.S. PATENT DOCUMENTS 4,215,154 A * 7/1980 Behensky et al. ............. 117/88
6,171,641 B1 * 1/2001 Okamoto et al. ........ 204/192.13

* cited by examiner

Primary Examiner—Carl Whitehead, Jr.
Assistant Examiner—Thanhha Pham
(74) Attorney, Agent, or Firm—Choate, Hall & Stewart

(57) ABSTRACT

The present method of manufacturing a semiconductor device has a step of forming a metal film on the surface of a group of semiconductor wafers by bringing the internal temperature of a chamber of a film formation device to a film formation temperature at which the metal film is deposited, followed by a step of lowering the temperature of the chamber to a standby temperature at a constant rate and holding the temperature of the chamber at the standby temperature until the film formation for the next group of the semiconductor wafers.

1 Claim, 3 Drawing Sheets

MANUFACTURE OF A SEMICONDUCTOR DEVICE

BACKGROUND OF THE INVENTION

1. Field of the Invention

The present invention relates to a method for manufacturing a semiconductor device, and more particularly to a method for manufacturing a metal film.

2. Description of the Prior Art

Continued efforts for refined design and high density configuration of the structure for semiconductor elements such as insulated gate field effect transistor (referred to as MOS transistor hereinafter) are still being pushed vigorously presently. As for the refinement, semiconductor elements formed with 0.13 to 0.18 $\mu$m rule are generally adopted at present, and memory devices, logic devices or the like based on this design rule are being put to practical use or being under development. Such a refinement is the most effective technique for enhancing the performance or multifunctional capability of the semiconductor devices through high integration and fast operation, and is an indispensable step for the manufacture of the future semiconductor devices. For the purposes of high integration, fast operation, multifunctional capability and low power consumption of the semiconductor devices, it is to be realized that the formation of metal films plays an extremely important role.

For example, accompanying high integration of ULSIs, groove wirings employing a conductive layer of copper (Cu) or a copper alloy have been proven to be very effective due to reduced resistance or enhancement in the resistance to electron migration of these wirings. In this case, it is indispensable to prevent the diffusion of copper that gives an adverse effect to the semiconductor elements, and hence, there arises a need for a barrier metal which prevents the diffusion of copper. In addition, a film of such metal as titanium (Ti) or a barrier metal such as titanium nitride (TiN) is indispensable for fine contact holes, through holes or the like that connect the wiring layers in a multilayer wiring structure. Moreover, for memory cells that is composed of one transistor and one capacitor, of a DRAM, an extremely thin barrier metal of titanium nitride or the like is also indispensable.

Such a metal film as described in the above is formed generally by a sputtering method. However, with the refinement of the semiconductor elements as mentioned in the above, an improvement in the step coverage becomes necessary in the formation of a metal film. With this in mind, a metal film, such as a titanium nitride film or a titanium film, is being formed by means of a chemical vapor deposition (CVD) method. However, the film formation temperature in this case has to be set considerably higher than in the case of the sputtering method.

A CVD device for the formation of such a metal film has, in a normal mass production facility, a plurality of reaction chambers (referred to also as process chambers). In other words, the CVD device has a capability for multichamber processing by which formation of various kinds of films can be handled by means of a single unit of the device.

Referring to FIG. 3, such a multichamber device will be described. Namely, a multichamber device 1 is equipped with a load lock chamber 2, a separate chamber 3, process chambers 4, 4a and 4b, and the like. In forming a metal film on a semiconductor substrate (referred to also as a wafer) made of silicon or the like, as described in the above, the wafer is loaded and unloaded onto and from the multichamber device through the load lock chamber 2. The wafer is transferred between the load lock chamber and the separate chamber, and between the separate chamber and the process chamber, respectively, by means of an arm. Here, in the multichamber device, the oxygen partial pressure and the concentration of moisture within the load lock chamber and the separate chamber are set low by increasing the degree of vacuum in these chambers.

In the following, the formation of a titanium nitride film as well as a titanium film using a single unit of the multichamber device will be described.

As shown in FIG. 3, a wafer is transferred into the separate chamber 3 through the load lock chamber 2 in order to form a titanium nitride film on the wafer. Here, the degree of vacuum of the separate chamber 3 is set at about 10 Pa. Then, the wafer is brought into the process chamber 4 to have a titanium nitride film formed on it.

In the formation of a titanium nitride film, the interior of the reaction chamber, namely, the process chamber 4, is held initially at a deposition temperature (TD) of about 700° C., and the following reaction gas is introduced into the process chamber 4. Namely, first gaseous titanium tetrachloride ($TiCl_4$) and gaseous ammonia ($NH_3$), then gaseous nitrogen ($N_2$) are introduced into the process chamber 4 to obtain the gaseous pressure within the reaction chamber of about 40 Pa. In this way, a titanium nitride film with thickness of about 50 nm is formed on the silicon substrate.

Now, in a mass production facility, after the formation of the titanium nitride film for a group of semiconductor wafers, namely, for one lot of the products (25 pieces of wafers, for example), there may be scheduled a case in which a titanium film is to be formed for another lot of products within the multichamber device. Thus, this time a situation arises where a titanium film is to be formed in the process chamber 4a for the lot of products by means of a plasma excited CVD (PECVD) method, for example.

During the formation of the titanium film the process chamber 4 is in the standby period for the next group of semiconductor wafers. At this point, the temperature within the process chamber 4 is lowered to a standby temperature (TS) as shown in FIG. 4. This is done so for the purpose of preventing the titanium nitride film, stuck on the inner wall of the process chamber 4 during the formation of the titanium nitride film, from being oxidized by the high temperature employed in the process. In the conventional method, the rate of the temperature drop in the transition from the film deposition temperature to the standby temperature is set at about 30° C./min in consideration of the mass productivity of the products.

When, after the completion of formation of the titanium film, formation of the titanium nitride film for the next group of the semiconductor wafers is about to be started again within the process chamber 4, the temperature in the process chamber 4 is raised from the standby temperature to the deposition temperature as shown in FIG. 4 to start the formation of the titanium nitride film for the group of the products. In the mass production of the semiconductor device, different kinds of metal films are formed using a single unit of mass production device as described in the above.

In the conventional manufacturing method of the semiconductor device, the rate of temperature drop from the deposition temperature to the standby temperature is large as mentioned above, and particles are liable to be generated in the process chamber for the formation of the titanium nitride film. Nonetheless, the effect of the method of temperature drop has not been examined carefully enough.

The inner wall of the conventional process chamber is subjected to an alumite treatment to have a coating of an alumina film. When the temperature within the process chamber is varied under such a circumstance, a metal film such as the titanium nitride film stuck on the inner wall of the process chamber tends to be peeled off the inner wall of the process chamber due to contraction or expansion.

A detailed examination by the present inventor using a metal film formation device as described above revealed that the peeling of the metal film depends heavily on the rate of temperature drop from the deposition temperature to the standby temperature. It has been considered that the generation of particles in the conventional method mentioned above is a result of an almost uncontrolled relatively large rate of temperature drop.

Generation of such particles deteriorates the yield of mass production of the semiconductor device, and the size of the particles that affects the mass production yield becomes smaller with the enhancement of the refinement and high performance, as mentioned above, of the semiconductor device. In this respect, the control of the rate of the temperature drop on the level of mass production becomes extremely important.

Furthermore, in the conventional technique, the dispersions between lots of the film thickness and the film quality of a metal film such as titanium nitride film are large, which seems to be a result also of the peeling of the metal film.

BRIEF SUMMARY OF THE INVENTION

Object of the Invention

It is the object of the present invention to provide a method of manufacturing a semiconductor device that makes it possible to prevent generation of particles in the film formation of a metal film on the mass production level.

Summary of the Invention

The method of manufacturing a semiconductor device according to this invention includes a step of forming a metal film on a group of semiconductor wafers by keeping the interior of a chamber of a film formation device at a deposition temperature of the metal film, and a step of then lowering the temperature of the interior of the chamber to a standby temperature at a constant rate and holding the interior of the chamber at the standby temperature until the film formation treatment of the next group of the semiconductor wafers.

BRIEF DESCRIPTION OF THE DRAWINGS

The above-mentioned and other objects, features and advantages of this invention will become more apparent by reference to the following detailed description of the invention taken in conjunction with the accompanying drawings, wherein.

DETAILED DESCRIPTION OF THE INVENTION

Figure 1:
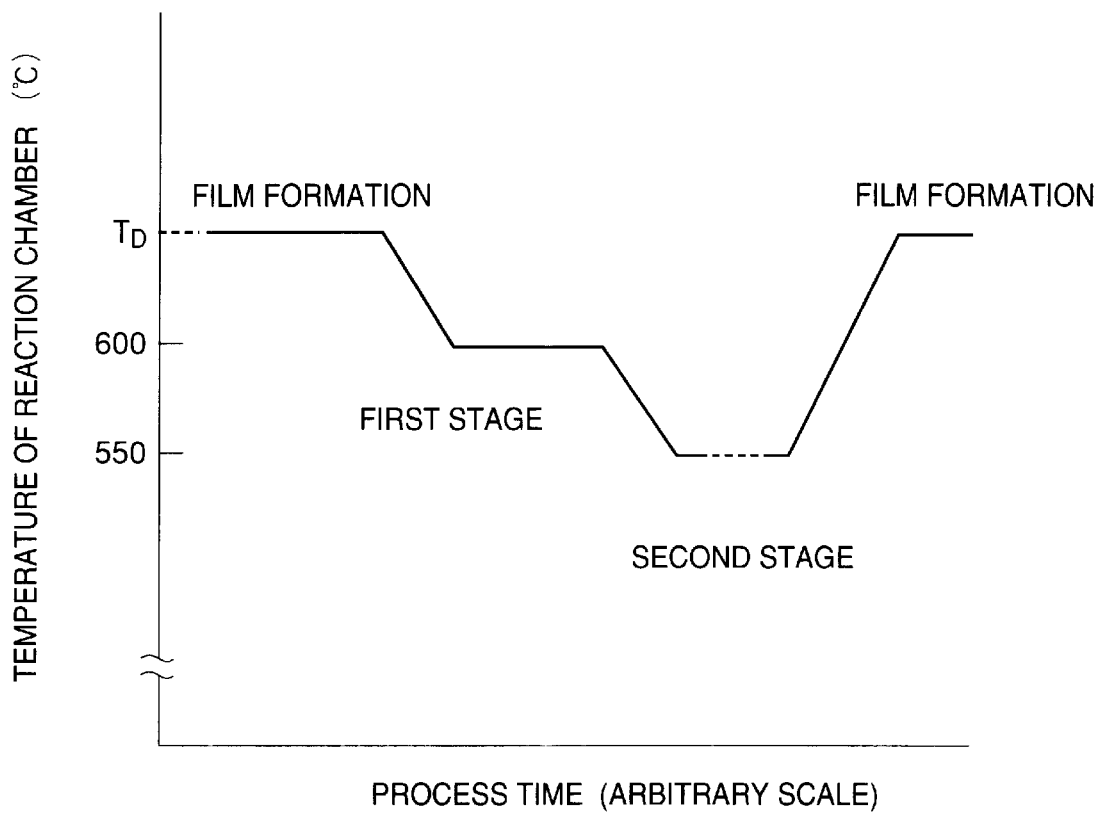
FIG. 1 is a graph showing the temperature change in the reaction chamber in the formation of a metal film in a first embodiment of the present invention.

Referring to the drawings, the present invention will be described next.

FIG. 1 is a diagram for describing the control of the internal temperature of a process chamber in a multichamber device. Namely, it is a diagram for describing the temperature changes between the deposition and standby processes.

Here, the description will cover as in the above the case of formation of a titanium nitride film and a titanium film using one unit of the multichamber device. Similar to the description for the prior art, a wafer is transferred to a separate chamber 3 through a load lock chamber in order to form a titanium nitride film on the silicon substrate. The degree of vacuum of the separate chamber 3 in this case is set at about 10 Pa Then, the wafer is transferred to a process chamber 4 to have a titanium nitride film formed on the substrate.

As shown in FIG. 1, the interior of the process chamber 4 is held initially at a deposition temperature (TD) of about 700° C. Then, gaseous titanium tetrachloride ($TiCl_4$), gaseous ammonia ($NH_3$) and gaseous nitrogen ($N_2$) are introduced into the process chamber 4 and its internal gaseous pressure is brought to about 40 Pa. In this way, a titanium nitride film of thickness of about 50 nm is formed on the silicon substrate. In a mass production facility, the internal temperature of the process chamber 4 is fixed to the deposition temperature, and a titanium nitride film is formed continuously for one lot (25 pieces of wafers, for example) of the products. Then, the device goes into the standby period as described in connection with the prior art.

When the standby period of the process chamber 4 arrives, the internal temperature of the process chamber 4 is lowered gradually to 600° C. at a rate of 2° C./min, and is held at 600° C. thereafter as shown in FIG. 1. This represents a first stage of the standby period. The upper limit of the standby period is set at about 6 hours. The upper limit is set within the time interval during which the metal film stuck on the internal wall of the process chamber 4 will not be oxidized.

Following that, the internal temperature of the process chamber 4 is lowered gradually from 600° C. to 550° C. at a rate of 2° C./min, and is held at 550° C. This represents a second stage of standby period. The standby process of two stages is thus formed.

When a titanium nitride film is to be formed again in the process chamber 4 while the chamber 4 is in the two-stage standby process, the internal temperature of the process chamber 4 is raised from the standby temperature to the deposition temperature as shown in FIG. 1 to carry out again the formation of a titanium nitride film on the product. Here, if the standby period is short and the notice for the formation of the titanium nitride film in the process chamber 4 is given during the holding period of 600° C., the internal temperature of the process chamber 4 is raised from 600° C. to the deposition temperature in a manner different from the graph as shown in FIG. 1.

With the constitution of the standby process of this invention described as in the above, generation of particles described in connection with the prior art is prevented completely, and the production yield of the semiconductor device is markedly improved.

Moreover, when forming a titanium nitride film of thickness 50 nm on the silicon substrate according to this embodiment, the dispersion in the film thickness from one wafer to another or from one lot to another is reduced remarkably.

Figure 2:
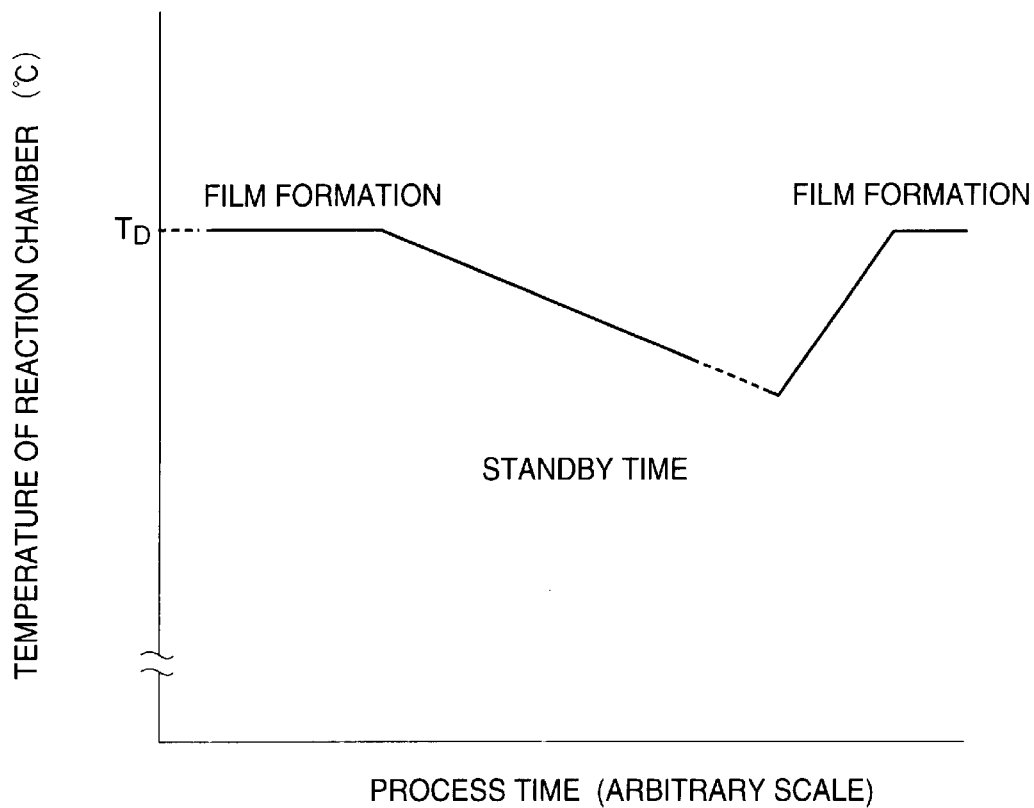
FIG. 2 is a graph showing the temperature change in the reaction chamber in the formation of a metal film in a second embodiment of the invention.
Figure 3:
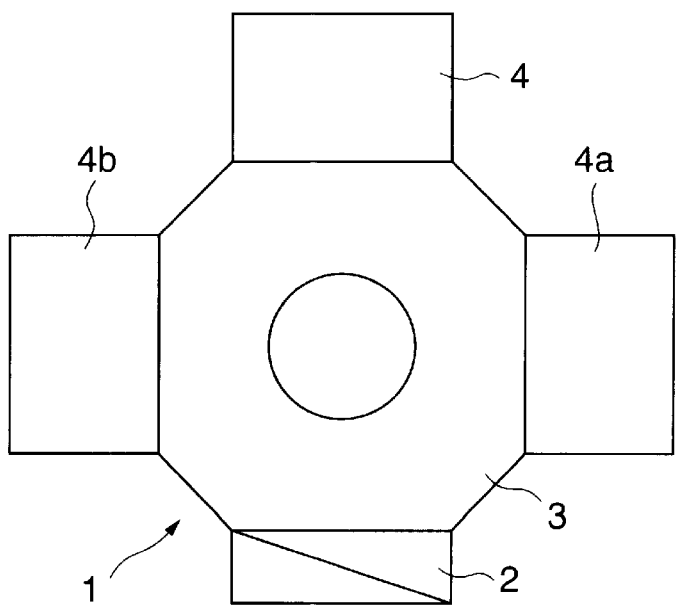
FIG. 3 is a schematic plan view of the multichamber device for describing the invention.
Figure 4:
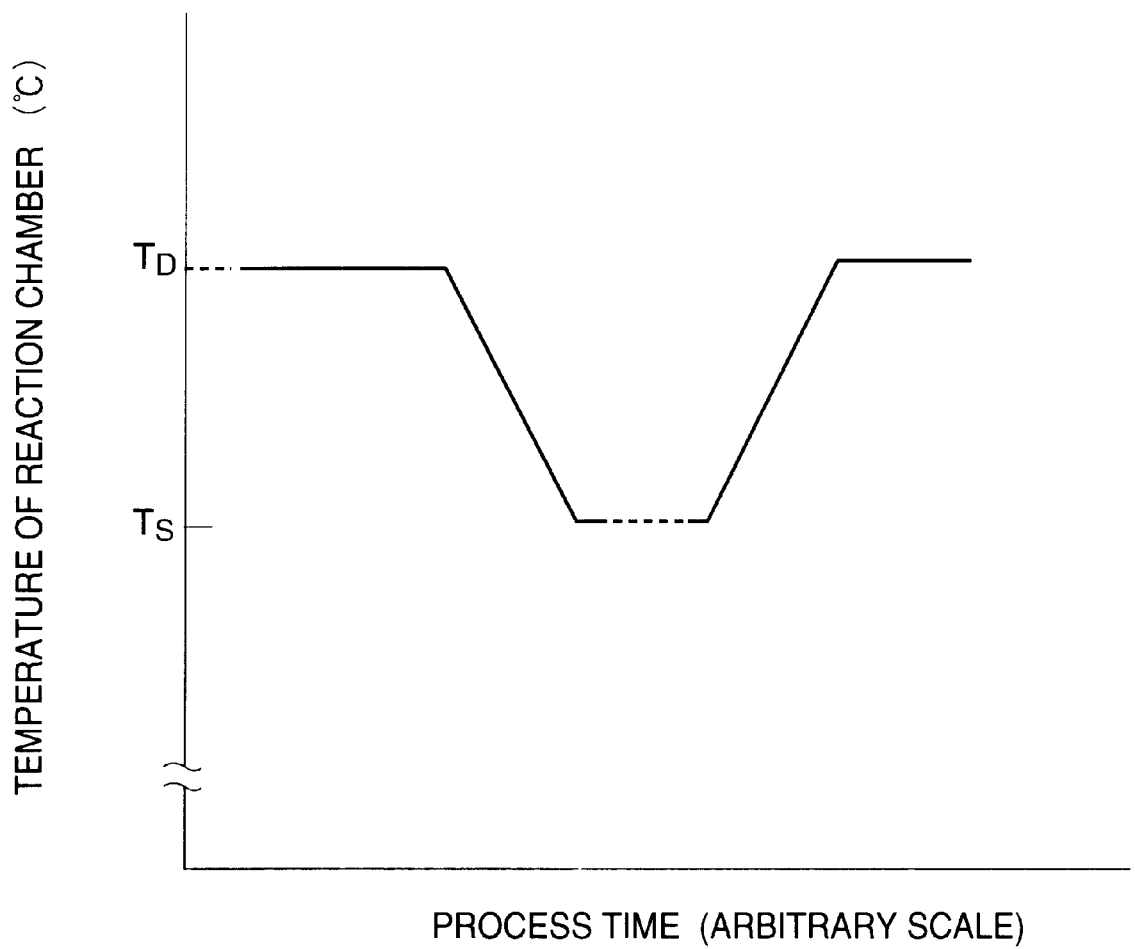
FIG. 4 is a graph showing the temperature change in the reaction chamber in the formation of a meal film in the prior art.

Next, based on FIG. 2 and FIG. 3, a second embodiment of this invention will be described next. FIG. 2 is a diagram showing the formation of another type of standby period. For this standby period, the case of forming a titanium nitride film and a titanium film as before using one unit of the multichamber device will be described.

As shown in FIG. 2, the interior of the process chamber 4 is held initially at a deposition temperature (TD) of about 700° C., and a titanium nitride film is formed continuously for one lot (25 pieces of the wafers, for example) of the products. After that, the device enters a standby period as described in connection with the first embodiment.

In the second embodiment, with the start of the standby period the internal temperature of the process chamber 4 is lowered gradually. The rate of the temperature drop at this time is set at 0.5° C./min with the final standby temperature set at 550° C.

When a titanium nitride film is to be formed again in the process chamber 4 while it is in the standby period, the internal temperature of the process chamber 4 is raised to the deposition temperature from the standby temperature to start the formation of the titanium nitride film on the product as shown in FIG. 2. The upper limit of the standby period in this case is set at 5 hours. The second embodiment is effective when the film formation cycle of the identical metal film in the mass production line is short.

With the second embodiment, the effect similar to that described in connection with the first embodiment can be obtained. Moreover, this case represents the formation of a single stage standby process with a simple operating process, and the work efficiency is improved over that of the first embodiment.

Furthermore, in the mass production line, a host computer may be connected to the multichamber device, and after the formation of a metal film, the lead time for the work on the next batch of the products may be estimated, and the temperature of the process chamber may be simulated to set the standby temperature. With these arrangements, the work efficiency in mass production can further be improved.

In the first embodiment, the case of two stages for the standby process has been described. However, the present invention is not limited to this case, and the standby temperature may be divided further finely to have a standby process with three or more stages. Such a multistage standby process will be more effective when the film formation cycle of the same metal is long.

Moreover, the above embodiments have been described taking the case of film formation using a multichamber device as an example, but the present invention is not limited to this case and is applicable similarly to the standby process in the reaction chamber of a stand-alone device.

Furthermore, in the formation of a metal film by the CVD method, formation of a titanium nitride film has been taken up as an example, but the present invention is not limited to this case alone, and is applicable also to the case of formation of a film of a high melting point metal or its nitride. The present invention is applicable to the formation by the CVD method of the films of high melting point metals such as titanium, tungsten (W), cobalt (Co), nickel (Ni), and tantalum (Ta), as well as the nitride films of high melting point metals such as tungsten nitride (WN) and tantalum nitride (TaN).

The present invention is not limited to the embodiment specifically described above, and it is obvious that these embodiments can be modified appropriately within the technical scope of the invention.

In the present invention, after the formation of a metal film on the surface of a group of semiconductor wafers by bringing the interior of a reaction chamber of a film formation device to a film formation temperature for deposition of the metal film, the temperature of the chamber is lowered to a standby temperature at a constant rate, and the chamber is held at the standby temperature until the film formation of the next group of the semiconductor wafers. Or, after forming a metal film on the surface of a group of semiconductor wafers by bringing the interior of the reaction chamber of the film formation device to a film formation temperature for deposition of the metal film, the temperature of the chamber is lowered stepwise to a standby temperature, and the chamber is made to stand by until the film formation for the next group of the semiconductor wafers. Here, the temperature drop from the deposition temperature to the standby temperature is carried out in two stages.

With this arrangement, in the film formation on the mass production level, it is possible to easily control and completely prevent the generation of particles in the reaction chamber.

Moreover, with this invention it becomes possible to carry out the formation of a metal film with high reliability and high precision using a CVD device having a multichamber structure. Furthermore, it is possible to reduce the dispersion of the thickness of the metal film among semiconductor wafers to a remarkable degree.

As a result, the present invention is capable of promoting the refinement or high performance of the semiconductor devices and enhancing the mass production yield of the semiconductor devices.

Although the invention has been described with reference to specific embodiments, this description is not to be construed in a limiting sense. Various modifications of the disclosed embodiments will become apparent to persons skilled in the art upon reference to the description of the invention. It is therefore contemplated that the appended claims will cover any modifications or embodiments as fall within the true scope of the invention.

What is claimed is:

1. A method of manufacturing a semiconductor device, comprising:

a step of forming a metal film on the surface of a group of semiconductor wafers by bringing the internal temperature of a chamber of a film formation device to a film formation temperature for depositing said metal film, and a step of then lowering the temperature of said chamber stepwise to a standby temperature to let said chamber stand by until the film formation for the next group of semiconductor wafers, wherein the temperature lowering of said chamber from the film formation temperature to the standby temperature is carried out in two stages, a first stage and a second stage, and wherein said metal film is a titanium nitride film and during said first stage the rate of the temperature lowering from said film formation temperature to a first temperature of 600° C. is 2° C./min and during said second stage the rate of the temperature lowering from 600° C. to said standby temperature of 550° C. is 2° C./min.

* * * * *